United States Patent [19]
Alsmeier

[11] Patent Number: 5,867,420
[45] Date of Patent: Feb. 2, 1999

[54] REDUCING OXIDATION STRESS IN THE FABRICATION OF DEVICES

[75] Inventor: Johann Alsmeier, Wappingers Falls, N.Y.

[73] Assignee: Siemens Aktiengesellschaft, Munich, Germany

[21] Appl. No.: 943,910

[22] Filed: Sep. 30, 1997

Related U.S. Application Data

[63] Continuation-in-part of Ser. No. 873,100, Jun. 11, 1997.

[51] Int. Cl.[6] ...................................................... G11C 11/24
[52] U.S. Cl. ............................................ 365/149; 365/150
[58] Field of Search ................................. 365/51, 149, 150

[56] References Cited

U.S. PATENT DOCUMENTS 5,323,343  6/1994  Ogoh et al. ............................ 365/149

Primary Examiner—Terrell W. Fears
Attorney, Agent, or Firm—Stanton C. Braden

[57] ABSTRACT

A random access memory cell having a trench capacitor formed below the surface of the substrate. A shallow trench isolation is provided to isolate the memory cell from other memory cells of a memory array. The shallow trench isolation includes a top surface raised above the substrate to reduce oxidation stress.

8 Claims, 8 Drawing Sheets

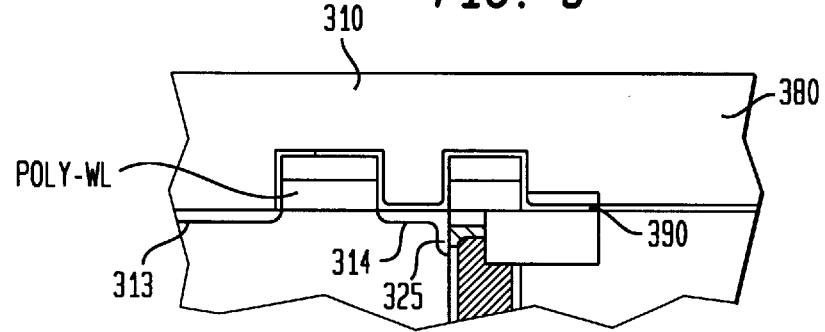
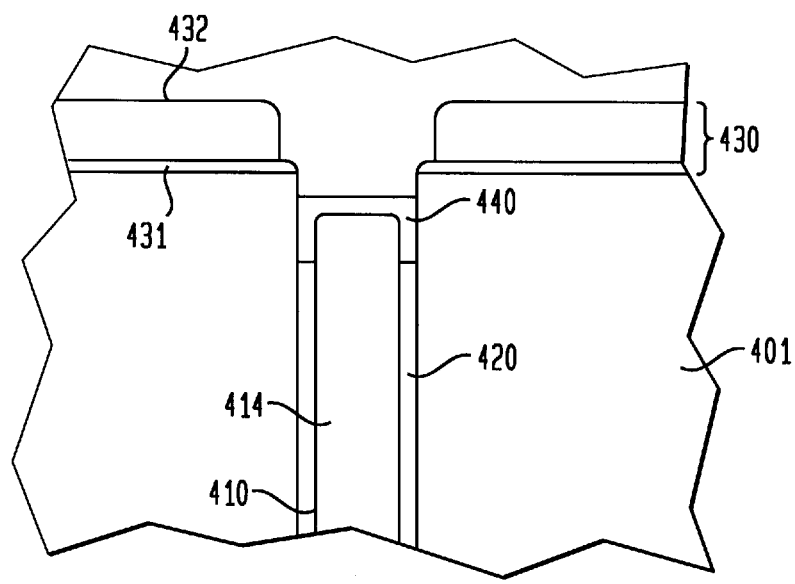

REDUCING OXIDATION STRESS IN THE FABRICATION OF DEVICES

This is a continuation-in-part of U.S. Ser. No. 08/873,100, filed on Jun. 11, 1997.

FIELD OF INVENTION

The invention generally relates to device fabrication such as random access memories and, more particularly, to reducing oxidation stress at the shallow trench isolation interface.

BACKGROUND OF INVENTION

In device fabrication, insulating, semiconducting, and conducting layers are formed on a substrate. The layers are patterned to create features and spaces. The minimum dimension or feature size (F) of the features and spaces depend on the resolution capability of the lithographic systems. The features and spaces are patterned so as to form devices, such as transistors, capacitors, and resistors. These devices are then interconnected to achieve a desired electrical function. The formation and patterning of the various device layers are achieved using conventional fabrication techniques, such as oxidation, implantation, deposition, epitaxial growth of silicon, lithography, and etching. Such techniques are described in S. M. Sze, *VLSI Technology*, 2nd ed., New York, McGraw-Hill, 1988, which is herein incorporated by reference for all purposes.

Random access memories, such as dynamic random access memories (DRAMs), comprise memory cells that are configured in rows and columns to provide storage of information. One type of memory cells includes, for example, a transistor connected to a trench capacitor. Typically, the capacitor plate, which is connected to the transistor is referred to as the "node" when activated, the transistor allows information to be read or written into the capacitor.

Continued demand to device miniturization to have resulted in DRAMs with smaller feature size and cell area. For example, reduction of the conventional cell area of $8F^2$ towards and below $6F^2$ have been investigated. However, the fabrication of such small feature and cell sizes creates oxidation stress, where the node is isolated from the substrate. The oxidation stress, in turn, creates dislocations which increases the node junction leakage current. Such increases in node leakage current adversely impacts the performance and operability of the memory cells.

From the above discussion, it is apparent that there is a need to reduce oxidation stress that results during the fabrication of devices.

SUMMARY OF INVENTION

The invention generally relates the reduction of oxidation stress at the node isolation region. In one embodiment, a random access memory cell implemented with a trench capacitor is provided with a raised shallow trench isolation. The trench capacitor, which is formed below the top surface of a substrate, such as a silicon wafer, serves as the storage node of the memory cell. The top surface of the raised shallow trench isolation is raised above the top surface of the silicon substrate to eliminate sacrificial and gate oxidation stress. The amount that the top surface of the shallow trench isolation is raised is sufficient to prevent the bottom of the divot formed during processing from being below the silicon surface.

BRIEF DESCRIPTION OF DRAWINGS

FIG. 3 shows a DRAM cell in accordance with the invention; and

FIGS. 4a–4f show the process for fabricating the DRAM cell of FIG. 3.

DETAILED DESCRIPTION OF THE INVENTION

The present invention relates to reducing oxidation stress during the fabrication of devices. For purposes of illustration, the present invention is described in the context of fabricating a trench capacitor memory cell. The memory cell is employed in an integrated circuit IC. Such IC or chip includes, for example, a random access memory (RAM), a dynamic random access memory (DRAM), or a synchronous DRAM (SDRAM). The IC can also be an application specific IC (ASIC), a merged DRAMlogic circuit (embedded DRAM), or any other logic circuit.

Typically, numerous ICs are formed on the wafer in parallel. After processing is finish, the wafer is diced to separate the ICs to individual chips. The chips are then packaged, resulting in a final product that is used in, for example, consumer products such as computer systems, cellular phones, personal digital assistants (PDAs), and other electronic products.

To facilitate understanding of the invention, a description of the fabrication of a conventional trench capacitor DRAM cell is provided.

Figure 1:
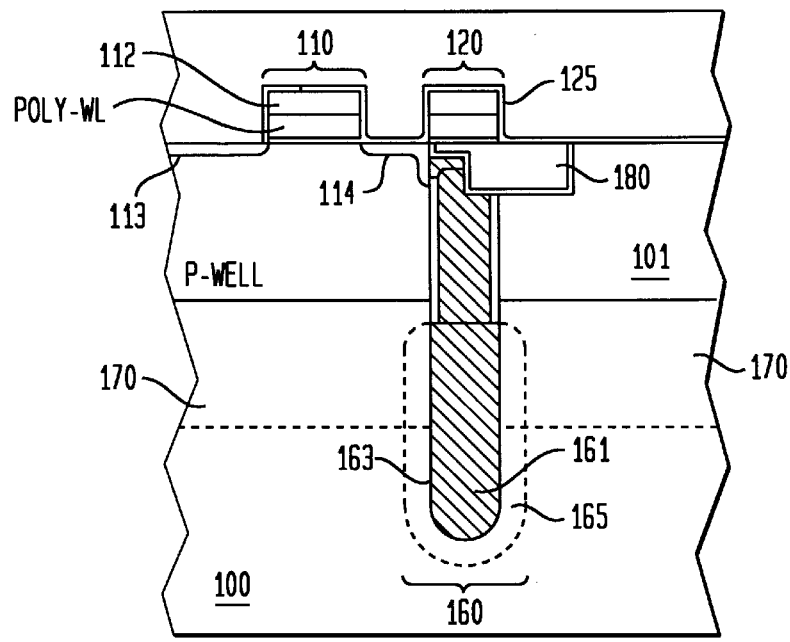
FIG. 1 shows a conventional DRAM cell.

Referring to FIG. 1, a conventional trench capacitor DRAM cell 100 is shown. Such conventional trench capacitor DRAM cell is described in, for example, Nesbit et al., *A 0.6 $\mu m^2$ 256 Mb Trench DRAM Cell With Self-Aligned BuriEd Strap(BEST)*, IEDM 93–627, which is herein incorporated by reference for all purposes. Typically an array of such cells are interconnected by wordlines and bitlines to form a DRAM chip.

The DRAM cell comprises a trench capacitor 160 formed in a substrate 101. Generally, the substrate is lightly doped with a dopant having a first conductivity. The trench is filled with, typically, polysilicon (poly) 161 heavily doped with dopants having a second conductivity. The poly serves as one plate of the capacitor. The other plate of the capacitor is formed by a buried plate 165, also having a second conductivity.

The DRAM cell also comprises a transistor 110. The transistor includes a gate 112, source 113, and drain 14. The drain and source are formed by implanting dopants having a second conductivity. The designation of the drain and source may change depending on the operation of the transistor. For convenience, the terms drain and source are interchangable. Connection of the transistor to the inner capacitor plate is achieved via a strap 125. The strap is formed by providing dopants having the same conductivity as the source. As shown, a buried strap is employed to connect the junction of the memory transistor to the inner plate of the trench (node). Other techniques, such as a surface strap, for connecting the transistor to the capacitor are also useful. To prevent the punchthrough of the node junction into the buried plate, a collar 168 is formed at a top portion of the trench. Punchthrough is undesirable as it affects the operability of the cell.

A buried well 170, also having dopants of the second conductivity, is provided below the surface of the substrate with a peak concentration of dopants at about the bottom of the collar. Typically, the well is lightly doped. The buried well serves to connect the buried plates of the individual DRAM cells in the array together.

Generally, the gate and source form a wordline and bitline, respectively, in the DRAM array. Activation of the transistor by providing the appropriate voltage at the wordline and bitline junction enables data to be written or read from the trench capacitor. A shallow trench isolation (STI) 180 is provided to isolate the DRAM cell from other cells or devices. To facilitate efficient use of substrate area, a wordline 120, which is not connected to the cell, is typically formed over the trench. Wordline 120 is referred to as the "passing wordline". As shown, the passing wordline is isolated from the trench by part of the STI. Such a configuration is referred to as a folded bitline architecture. Other bitline architectures such as open or open-folded are also useful.

Illustratively, the first conductivity is positive (p) and the second conductivity is negative (n). However, those skilled in the art will appreciate that DRAM cells formed in a n-type substrate with p-type poly filled trenches are also useful. Further, it is possible to heavily or lightly dope the substrate, wells, buried plate, and other elements of the DRAM cell with impurity atoms to achieve the desired electrical characteristics.

Figure 2A:
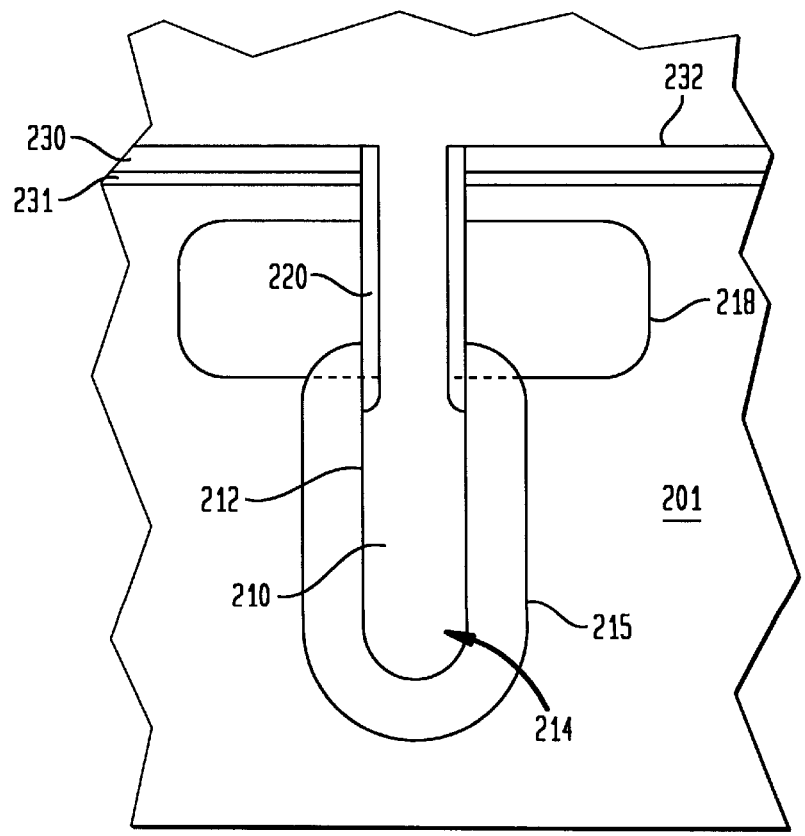
FIGS. 2a–g show the process for fabricating the conventional DRAM cell of FIG. 1.

FIGS. 2a–2g depict a part of process of forming the conventional DRAM cell. Referring to FIG. 2a, a substrate 201 for forming the DRAM cell is provided. The substrate comprises, for example, a silicon wafer. Other substrates such as gallium arsenide, germanium, silicon on insulator (SOI), or other semiconductor materials are also useful. The major surface of the substrate is not critical and any suitable orientation such as an (100), (110), or (111) is useful. The substrate, for example, may be lightly or heavily doped with dopants of a predetermined conductivity to achieve the desired electrical characteristics. In an exemplary embodiment, the substrate is lightly doped with p-type dopants (p$^-$). A pad stack 230 is formed on the surface of the substrate. The pad stack comprises various layers functioning as an etch mask, etch stop, and/or chemical mechanical polish stop layers. Typically, the pad stack comprises a pad oxide layer 231, nitride layer 232, and TEOS mask layer (not shown).

A trench 210 is formed in the substrate. Techniques for forming the trench is described in, for example, Muller et al., *Trench Storage Node Technology for Gigabit DRAM Generation*, IEDM 96–507, which is already herein incorporated by reference for all purposes. The trench is filled with heavily doped n-type (n$^+$) poly 214 (referred to as poly #1). The n$^+$ poly serves as one plate of the capacitors. A n$^+$ buried plate 215 surrounds the bottom portion of the trench and serves as the other plate of the capacitor. The trench and buried plate are isolated from each other by a node dielectric layer 212. In one embodiment, the node dielectric layer comprises nitride and oxide layers. In an upper portion of the trench, a collar 220 is formed. The collar comprises a dielectric material such as, for example TEOS. Additionally, a buried N$^-$ well 280 is provided for connecting the other trenches in the array together.

Figure 2B:
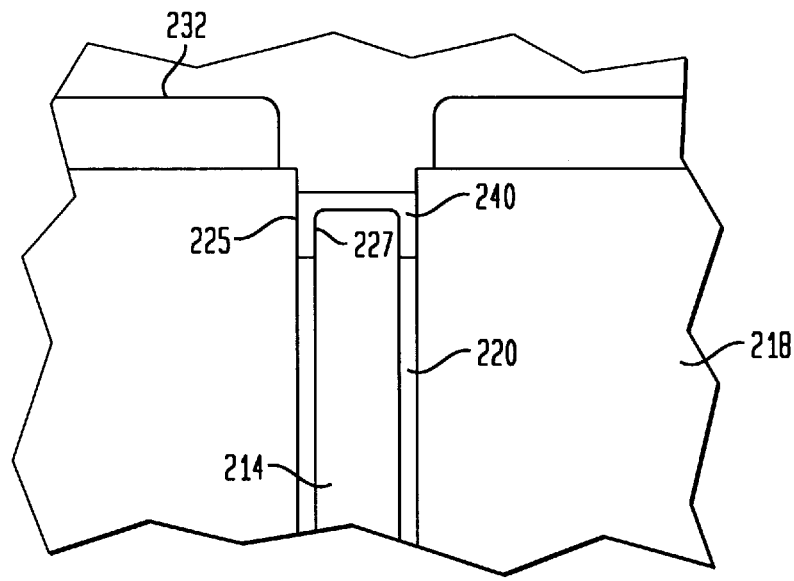

FIG. 2a–b show the formation of the buried strap. As shown in FIG. 2a, the surface of the substrate have been polished by, for example, Chemical Mechanical Polishing (CMP). The nitride layer 232 serves as an CMP stop layer, causing the CMP to stop once it reaches the nitride layer. As a result, the poly (referred to as poly #2) that covers the surface of the substrate is planarized, leaving a substantially planar surface between the nitride and poly for subsequent processing.

Referring to FIG. 2b, the formation of the strap for connecting the trench to the transistor of the DRAM cell is shown. The poly is recessed, by for example, reactive ion etching (RIE). Typically, the poly is recessed to about 150 nm below the silicon surface. After the poly is recessed, a clean step is performed to remove any native oxide that may have formed on the silicon trench sidewall. The clean step comprises, for example, a wet etch selective to silicon. The clean step removes the oxide from the trench sidewalls as well as a to portion of the collar, recessing it below the N$^+$ poly. As a result, a gap between the silicon and poly sidewalls 225 and 227 is formed.

A poly layer 240 is deposited on the substrate, covering the nitride layer and top portion of the trench. Typically, the poly layer is an intrinsic (or undoped) poly layer. The poly layer is planarized down to the nitride layer 232. After planarization, the poly in the trench is recessed to, for example, about 50 nm below the surface of the substrate, leaving a strap of about 100 nm above the n$^+$ trench poly.

Figure 2C:
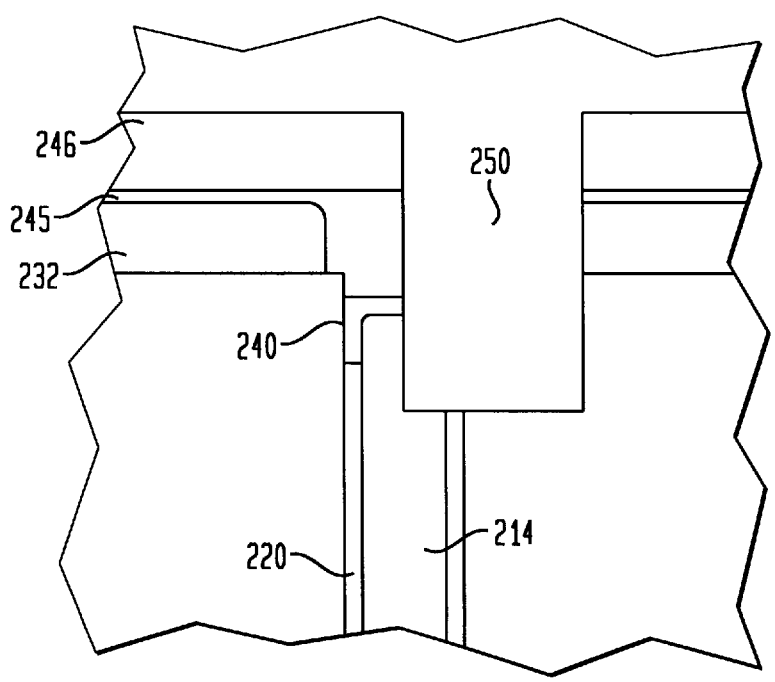

FIG. 2c shows the process for defining the active area of the DRAM cell. As shown, an anti-reflective coating (ARC) layer 245 is deposited on the substrate surface, covering the nitride layer 232 and strap 240. ARC is used to improve the resolution of the lithographic process for defining the active area (AA). A resist layer 246 is formed above the ARC layer, serving as an AA etch mask. The active region is then defined by conventional lithographic technique. The nonactive region 250 of the cell is then anisotropically etched by, for example, RIE. As shown, the nonactive region overlaps a portion of the trench. Typically, the nonactive region is etched below the top of the oxide collar. By having an opening, dopants in the trench poly are able to diffuse upward and outward to form the buried strap which connects the inner plate of the capacitor the trench to the transistor in a subsequent anneal. In one embodiment, the nonactive region is etched about 250–400 nm below the silicon surface. The nonactive region is the region where a STI is to be formed.

Figure 2D:
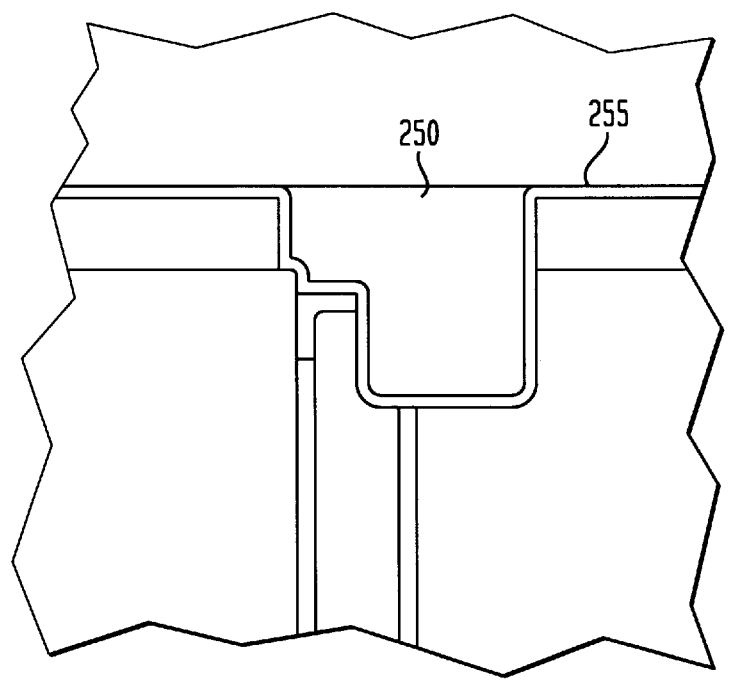

Referring to FIG. 2d, formation of the STI is shown. The resist and ARC layers are removed. To ensure that no resist or ARC residues remain, clean steps may be employed. Because several oxygen anneal are typically performed thereafter, oxygen molecules can diffuse through the collar oxide and oxidize the trench poly and the silicon sidewalls of the trench. Oxidation in the silicon sidewall and trench poly results in what is referred to as a bird's beak. Bird's beak causes stress and silicon dislocations to form, adversely impacting the operability of the device. To prevent oxygen from diffusing into the silicon and poly sidewalls, a nitride liner 255 is provided to protect the nonactive region. Typically, a passivation oxide is thermally grown on the exposed silicon prior to forming the nitride liner. The nitride liner is formed by, for example low pressure chemical vapor deposition (LPCVD). As shown, the nitride liner is formed over the substrate surface, covering the pad nitride layer and nonactive STI region.

Deposition of a dielectric material such as, for example, TEOS on the surface of the substrate to sufficiently fill the nonactive region 250. Since the TEOS layer is conformal, a planarization scheme is employed to result in a planar surface for subsequent processing. Such scheme, for example, is described in Nag et al., *Comparative Evaluation of Gap-Fill Dielectrics in Shallow Trench Isolation for Sub-0.25 µm Technologies*, IEDM 96–841, which is herein incorporated by reference for all purposes. The surface of the substrate is polished so that the STI and nitride layer are substantially planar.

Figure 2E:
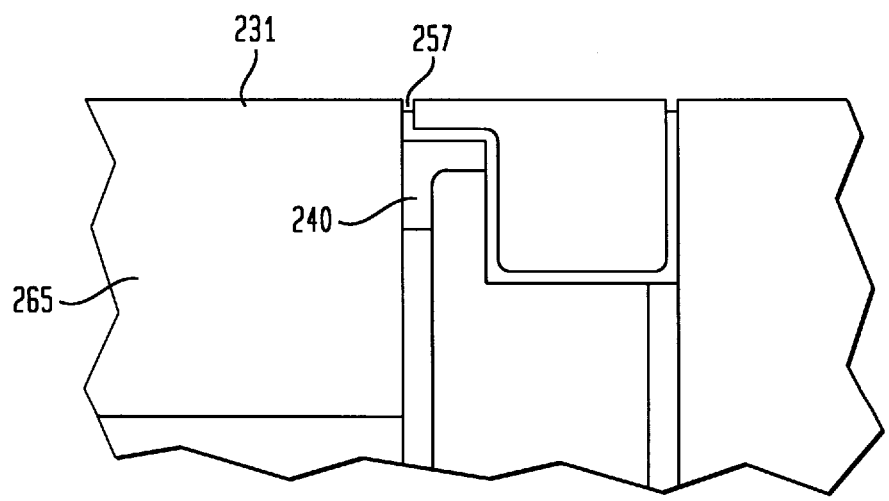

FIG. 2e shows the process for forming the access transistor of the DRAM cell. As shown, the pad nitride layer is removed by, for example, wet chemical etch. The wet chemical etch is selective to oxide. To ensure that the nitride layer is completely removed, an overetch is employed. During the overetch, the nitride liner at the top of the STI also gets recessed, forming a divot 257. The pad oxide is also removed at this point by wet chemical selective to silicon. However, the divot formed during the nitride etch exposes the oxide sidewalls on each side of the nitride liner. As such, the subsequent oxide etches further expand the divot vertically along the sidwall of the active area.

Figure 2F:
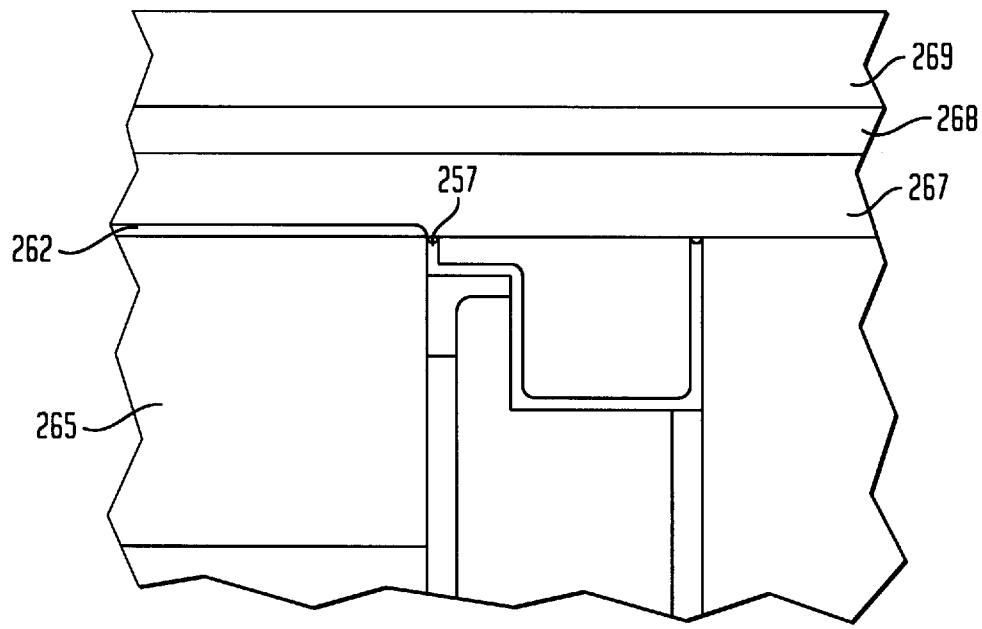

Subsequently, in FIG. 2f, an oxide (not shown) layer is then formed on the surface of the wafer. The oxide layer, referred to as a "gate sacrificial layer", serves as a screen oxide for subsequent implants. Additionally, the gate sacrificial layer rounds the STI corner.

To define a region for a p-type well 265 for the n-channel access transistor of the DRAM cell, a resist layer (not shown) is deposited on top of the oxide layer and appropriately patterned to expose the P-well region.

P-type dopants, such as boron (B) are implanted into the well region. The dopants are implanted sufficiently deep to prevent punchthrough. The dopant profile is tailored to achieve the desired electrical characteristics, e.g., gate threshold voltage ($V_t$).

In addition, p-wells for n-channel support circuitry are also formed. For complimentary wells in complimentary metal oxide silicon (CMOS) devices, n-wells are formed. Formation of n-wells require additional lithographic and implant steps for defining and forming the N wells. As with the p-wells, the profile of the n-wells are tailored to achieve the desired electrical characteristics. After the wells have been form, the gate sacrificial layer is removed.

Figure 2G:
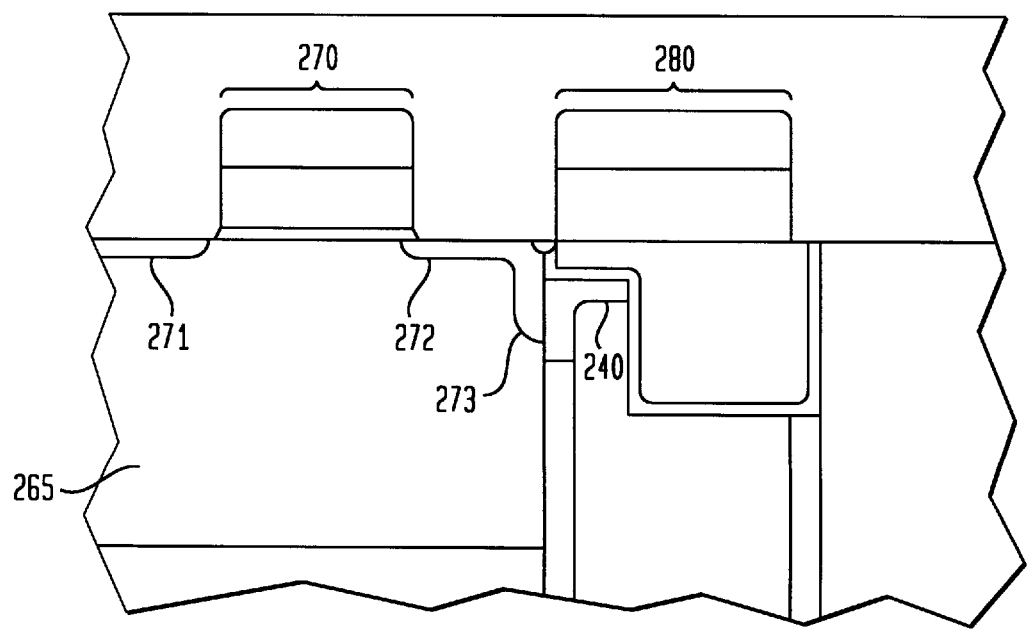

A gate oxidation layer 262 is formed and patterned to cover the region where the transistor is to be formed. Poly 267, $WSi_x$ 268, and nitride 269 layers are then formed over the surface of the substrate. As can be seen, the divot is filled with poly as well. Referring to FIG. 2g, these layers are then patterned to form a gate stack for a transistor 270 of the DRAM cell. A passing gate stack 280 is typically formed over the trench and isolated therefrom by the STI-oxide. Drain 271 and source 272 are formed by implanting dopants having the appropriate profile to achieve the desired operating characteristics. To improve diffusion and alignment of the source and drain to the gate, nitride spacers (not shown) may be employed. To connect the transistor to the trench, a strap 273 is created by outdiffusing dopants from the strap poly 240.

As previously discussed, the divot 257 formed near the corner of the active region adversely affects the operability of DRAM integrated circuit, such as parasitic corner conduction.

FIG. 3 shows an illustrative embodiment of the invention. As shown, a DRAM cell comprises a trench capacitor 360 and a transistor 310. Since the trench capacitor is similar to that described in FIG. 1, only the top portion is shown. Illustratively, the transistor 310 is a n-channel transistor. The transistor includes a gate 312, source 313, and drain 314. The drain and source are formed by implanting n-type dopants. Connection of the transistor to the capacitor is achieved via a doped region 325. The doped region is formed by diffusing n-type dopants from the trench. A dielectric collar 368 is provided to prevent vertical punchthrough between the strap and buried plate (not shown).

In accordance with the invention, a raised STI is provided to isolate the DRAM cell from other DRAM cells or devices. As shown, the depth of the raised STI is similar to that of a conventional STI. However, a top surface of the raised STI is located above the plane of the silicon substrate surface. The distance that top surface is raised above the substrate surface is sufficient to effectively reduce formation of divots below the silicon surface in order to reduce corner reduction. In one embodiment, the distance that the top surface of the raised STI is raised is about <100 nm. Preferably, the distance is about 20–100 nm, more preferably about 40–80 nm, and even more preferably about 50–70 nm. In another embodiment, the distance that the top surface of the raised STI is raised is about 50 nm.

As previously discussed, the formation of divots results in parasitic corner conduction. However, the present invention prevents the formation of divots by raising the surface of the STI above the substrate surface. Furthermore, as will be apparent, the use of the raised STI advantageously eliminates the need of a nitride liner which also contributes to divot formation.

Figure 4B:
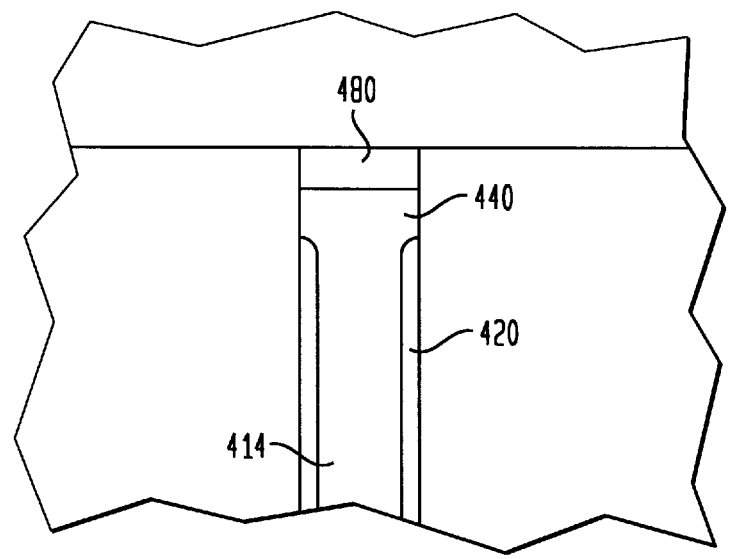

FIGS. 4a–4f show the process for forming a DRAM cell with a raised STI. Referring to FIG. 4a, a trench capacitor 410 is formed in a substrate 401. In an exemplary embodiment, the substrate is lightly doped with p-type dopants (p⁻). Typically, a pad stack 430 is formed on the surface of the substrate. The pad stack comprises various layers that serve as a etch mask, etch stop, and/or chemical mechanical polish stop layers. Typically, the pad stack comprises a pad oxide layer 431, nitride layer 432, and TEOS mask layer (not shown).

In one embodiment, the trench 410 is formed by conventional techniques. Such techniques are described in, for example, Nesbit et al., *A 0.6 µm² 256 Mb Trech DRAM Cell With Self-Aligned BuriEd Strap(BEST)*, IEDM 93–627, which is already herein incorporated by reference for all purposes. Illustratively, the trench is filled with N⁺ poly 414. In an upper portion of the trench, a collar 420 comprising a dielectric material such as, for example TEOS, is provided. A layer of intrinsic poly 440 is formed and recessed to above the collar and doped poly. Typically, the poly is recessed to, for example, about 50 nm below the surface of the substrate, leaving a strap 440 of, for example, about 100 nm above the N⁺ trench poly.

Referring to FIG. 4b, a layer of oxide is formed over the substrate surface, covering the pad stack and filling the opening above the trench. In one embodiment, the oxide layer is formed by low pressure chemical vapor deposition (LPCVD). The oxide is densified. Densification of the oxide is achieved by an anneal of about 900°–100° C. for about 10–60 minutes in and inert ambient such as Argon or nitrogen. The CMP results in a thin oxide layer 480 on top of the poly, providing isolation for the trench.

Subsequently, the pad nitride and pad oxide layers are removed by, for example, a wet etch. A sacrificial oxide layer (not shown) is then formed on the surface of the wafer. The oxide layer serves as a screen oxide layer for implants.

P-type well region for the n-channel access transistor of the DRAM cell is formed. This is achieved by, for example, depositing a resist layer (not shown) on top of the oxide layer and appropriately patterning it to expose the p-well region. P-type dopants, such as boron (B) are implanted into the well region. The dopants are implanted sufficiently deep to prevent punchthrough. The dopant profile is tailored to achieve the desired electrical characteristics, e.g., gate threshold voltage ($V_t$). The different thermal budget on the well dopants due to the subsequent raised STI passivation oxidation and oxide fill densification anneal are taken into account when designing the desired dopant profiles.

In addition, p-wells for n-channel support circuitry are also formed. For complimentary wells in complimentary metal oxide silicon (CMOS) devices, n-wells are formed. Formation of n-wells require additional lithographic and implant steps for defining and forming the n-wells. As with the P wells, the profile of the n-wells are tailored to achieve the desired electrical characteristics. After the implants are completed, the screen oxide layer is removed by, for example, a wet etch.

Figure 4C:
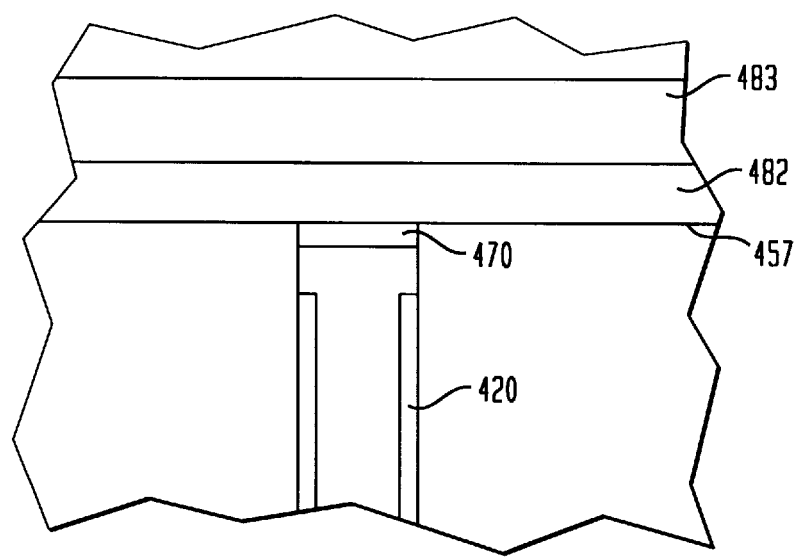

Referring to FIG. 4c, a gate oxide layer 457 is formed over the active area of the device. Poly layer 482 and nitride layer 483 are sequentially formed over the substrate surface after the creation of the gate oxide. The poly layer is sufficiently thick to offset the top of the subsequently formed raised STI oxide over the silicon substrate surface. In one embodiment, the poly layer is about 50 nm. The nitride layer is sufficiently thick to serve as a polish stop. Typically, the nitride layer is about 100 nm thick.

Figure 4D:
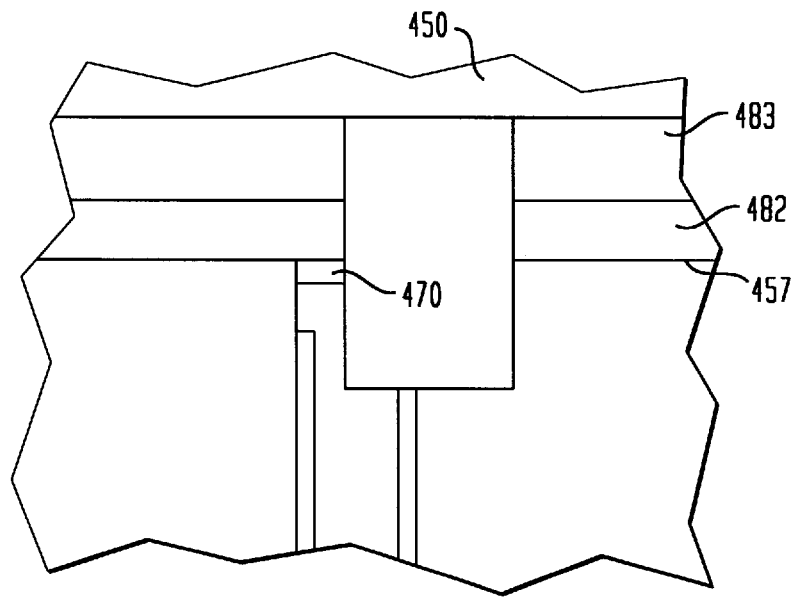

FIG. 4d shows the process for defining the active area of the DRAM cell. The active area is defined using conventional lithographic techniques. After the areas are defined, the non-active region 450 is anisotropically etched by, for example, RIE. To improve the resolution of the lithographic process, an anti-reflective layer may be used. As shown, the non-active region overlaps a portion of the trench, leaving a remaining portion to permit a sufficient amount of current to flow between the transistor and capacitor. In one embodiment, the non-active region overlaps $\leq$ about half the trench width, preferably about half the trench width. The non-active region is sufficiently deep to isolate the buried strap from the silicon sidewall opposite the side where the transistor of the DRAM cell is to be formed. The non-active region is etched below the top of the oxide collar. In one embodiment, the non-active region is etched about 250 nm below the silicon surface. The non-active region is the region where a raised STI is to be formed.

A dielectric material such as, for example, TEOS is deposited on the surface of the substrate to sufficiently fill the nonactive region 450. Since the TEOS layer is conformal, planarization schemes utilizing, for example, CMP, is performed to planarize the structure. Thereafter, the nitride layer is removed, resulting in the raised STI 455 having its top surface planar with the top surface of the poly 482 layer. The removal of the nitride layer may cause a divot 490 to form. However, since the STI is raised, the divot does not extend below the substrate surface. As a result, corner conduction is reduced or eliminated, making $V_t$ of the transistors more uniform.

Figure 4E:
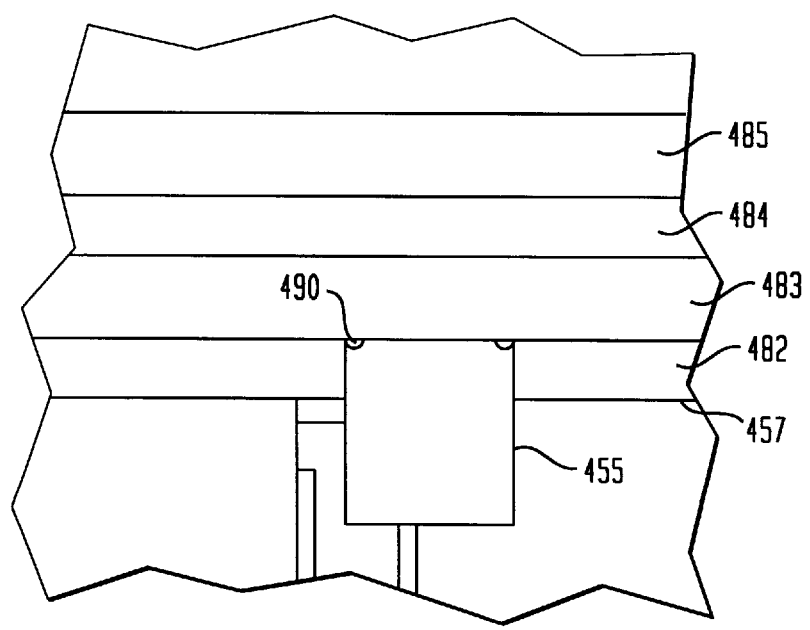

Referring to FIG. 4e, a poly layer 483 is formed over the poly layer 482. The combined thickness of the poly layers is sufficient to formed the gate conductor. In one embodiment, the thickness of the combined layers is about 100 nm. Optionally, a silicide layer 484 comprising refractory metals, such as $WSi_x$ to reduce the resistance of the gate conductor, is formed over the poly. A nitride layer 484 is formed above the polycide layer or, if no polycide layer is used, above the poly layer 483. The nitride layer serves as an etch stop for boarderless bitline contact etch.

Figure 4F:
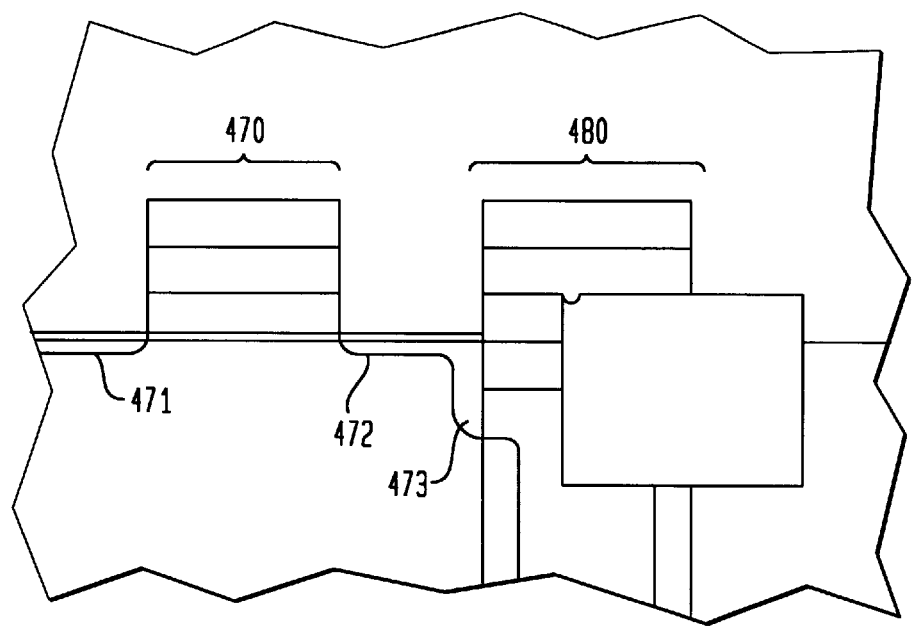
Figure 5:
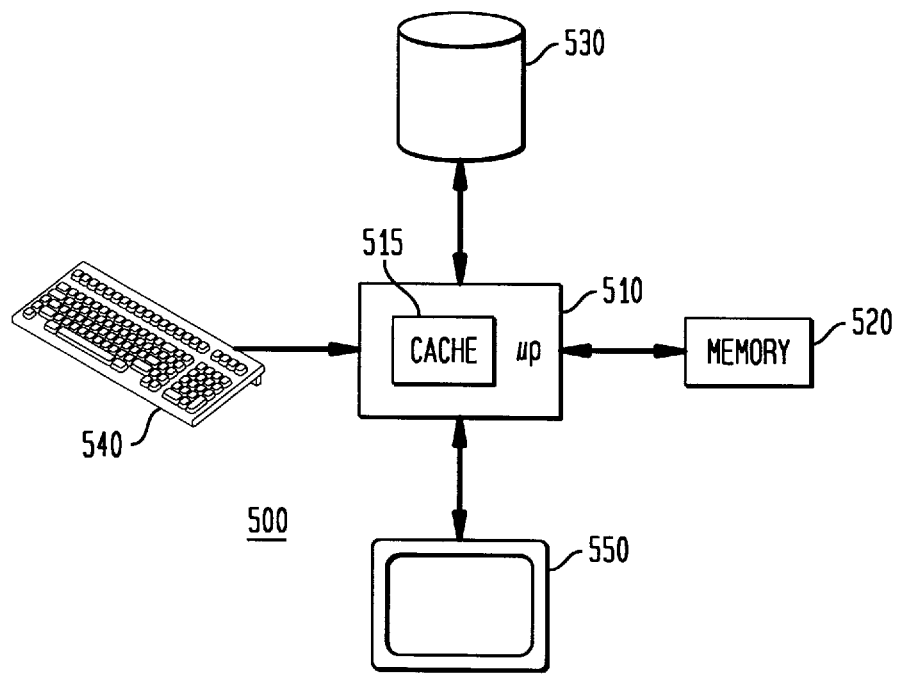
FIG. 5 shows a computer system employing a DRAM IC in accordance with the invention.

In FIG. 4f, the surface of the substrate is patterned to form a gate stack for a transistor 470 of the DRAM cell. A passing gate stack 480 is typically formed over the trench and isolated therefrom by the raised STI-oxide. Drain 471 and source 472 are formed by implanting dopants having the appropriate profile to achieve the desired operating characteristics. To improve diffusion and alignment of the source and drain to the gate, nitride spacers (not shown) may be employed.

Referring to FIG. 4, a typical computer system 400 is shown. As shown, the system includes a processor 410 which, for example, is a microprocessor such as those produced by Intel. The processor performs arithmetical and logical operations as provided by the processor's instruction set. Computer programs and data are stored in the computers memory storage 430. The memory storage includes magnetic or optical memory storage elements.

A keyboard 440 is provided to input commands to the system, as desired by a user. Other input device such as a mouse for inputting instructions by "point and click" technique may also be provided. The command, for example, executes a computer program stored in the computer's storage. The computer program is then loaded into the computer's memory or RAM. The RAM includes DRAM ICs such as those described in the invention. Data stored in a data file located in the computer's storage and which is required for the execution of the computer program is also transferred to the computer's RAM. Additionally, the user inputs data as required or desired, via the input device or devices.

Portion of the data and computer program that are recently or often used are stored in the computer's high speed memory 415 known as the "cache". The cache, illustratively, is part of the processor. The results of the program are then provided to the user via a display 450.

While the invention has been particularly shown and described with reference to various embodiments, it will be recognized by those skilled in the art that modifications and changes may be made to the present invention without departing from the scope thereof. Merely by way of example, the illustrative embodiments of the invention have been described with specific dimensions. These dimensions, however, are exemplary and may vary according to specific applications. The scope of the invention should therefore be determined not with reference to the above description but with reference to the appended claims along with their full scope of equivalents.

What is claimed is:

1. A computer system comprising:
    a memory, wherein the memory includes a random access memory cell comprising:
    a trench capacitor, said trench capacitor formed beneath a major surface of a silicon substrate;
    a transistor comprising gate, source and drain regions, wherein said drain region of said transistor is electrically coupled to said trench capacitor; and
    a raised shallow trench isolation (RSTI), said RSTI having a top surface that is above the major surface of the silicon substrate wherein the amount of the top surface of the RSTI above the major surface of the silicon is enough for protecting the substrate surface and for preventing a divot in the substrate surface.

2. The computer system of claim 1 wherein the top surface of the RSTI is less than 100 nm above the silicon substrate.

3. The computer system of claim 1 wherein the top surface of the RSTI is between 20–100 nm above the silicon substrate.

4. The computer system of claim 1 wherein the top surface of the RSTI is between 20–100 nm above the silicon substrate.

5. The computer system of claim 1 wherein the top surface of the RSTI is between 50–70 nm above the silicon substrate.

6. The computer system of claim 1 wherein the top surface of the RSTI is at least 50 above the silicon substrate.

7. The computer system of claim 1 wherein the top surface of the RSTI is above the substrate enough for preventing oxidation stress.

8. The computer system of claim 1 wherein the top surface of the RSTI is above the substrate enough for reducing conduction at the corners of the RSTI.

\* \* \* \* \*